US010967588B2

(12) United States Patent
Yamada et al.

(10) Patent No.: US 10,967,588 B2
(45) Date of Patent: *Apr. 6, 2021

(54) METHOD OF MANUFACTURING LIGHT EMITTING DEVICE (71) Applicant: NICHIA CORPORATION, Anan (JP)

(72) Inventors: Motokazu Yamada, Tokushima (JP); Masakazu Kotani, Tokushima (JP); Tetsuji Seino, Anan (JP); Shinsaku Ikuta, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/737,904

(22) Filed: Jan. 9, 2020

(65) Prior Publication Data
US 2020/0147908 A1 May 14, 2020

Related U.S. Application Data (63) Continuation of application No. 16/393,926, filed on Apr. 24, 2019, now Pat. No. 10,569,487, which is a (Continued)

(30) Foreign Application Priority Data

Mar. 13, 2015 (JP) ................... 2015-050645

(51) Int. Cl.
B29D 11/00 (2006.01)
H01L 33/54 (2010.01)
(Continued)

(52) U.S. Cl.
CPC .... *B29D 11/00865* (2013.01); *B29D 11/0074* (2013.01); *B29D 11/00807* (2013.01); (Continued)

(58) Field of Classification Search
None
See application file for complete search history.

(56) References Cited

U.S. PATENT DOCUMENTS 9,956,731 B2 * 5/2018 Yamada ................. H01L 33/00
10,391,727 B2 8/2019 Yamada et al.
(Continued)

FOREIGN PATENT DOCUMENTS

JP 2007-048883 2/2007
JP 2011-138815 7/2011
(Continued)

OTHER PUBLICATIONS

Yamamoto et al., Machine translation of Japanese Kokai Publication No. JP2012-015318.
(Continued)

*Primary Examiner* — Kristy A Haupt
(74) *Attorney, Agent, or Firm* — Mori & Ward, LLP (57) ABSTRACT A method of manufacturing a light emitting device includes providing a substrate on which a light source is disposed. An underfill material is ejected from a nozzle onto the substrate substantially around the light source in a circular shape, a shape of a letter 'C', or a rectangular shape. A covering member having a recess portion is provided above the light source.

20 Claims, 5 Drawing Sheets

Related U.S. Application Data continuation of application No. 15/925,848, filed on Mar. 20, 2018, now Pat. No. 10,391,727, which is a continuation of application No. 15/067,239, filed on Mar. 11, 2016, now Pat. No. 9,956,731.

(51) Int. Cl.
  *H01L 33/00* (2010.01)
  *B29K 83/00* (2006.01)
  *B29K 105/04* (2006.01)
  *B29L 31/34* (2006.01)
  *H01L 33/50* (2010.01)

(52) U.S. Cl.
  CPC .............. *H01L 33/00* (2013.01); *H01L 33/54* (2013.01); *B29K 2083/00* (2013.01); *B29K 2105/04* (2013.01); *B29K 2995/0018* (2013.01); *B29L 2031/3481* (2013.01); *H01L 33/505* (2013.01); *H01L 2933/005* (2013.01)

(56) References Cited

U.S. PATENT DOCUMENTS

| | | | |
|---|---|---|---|
| 10,569,487 B2* | 2/2020 | Yamada | B29D 11/00865 |
| 2007/0195534 A1 | 8/2007 | Ha et al. | |
| 2011/0032704 A1* | 2/2011 | Oh | G09G 3/14 |
| | | | 362/249.14 |
| 2012/0126144 A1* | 5/2012 | Lee | H01L 33/505 |
| | | | 250/462.1 |
| 2012/0267663 A1 | 10/2012 | Park et al. | |
| 2013/0300285 A1 | 11/2013 | Ito | |
| 2014/0061684 A1* | 3/2014 | Marutani | H01L 33/62 |
| | | | 257/88 |
| 2015/0041844 A1* | 2/2015 | Okahisa | H01L 33/54 |
| | | | 257/98 |

FOREIGN PATENT DOCUMENTS

| | | |
|---|---|---|
| JP | 2012015318 A * | 1/2012 |
| JP | 2012-243641 | 12/2012 |
| JP | 2013-149690 | 8/2013 |
| JP | 2014-011415 | 1/2014 |
| JP | 2015-035438 | 2/2015 |
| WO | WO 2012/099145 | 7/2012 |
| WO | WO 2013/153945 | 10/2013 |

OTHER PUBLICATIONS

Office Action with Form PTO-892 Notice of References Cited issued by the U.S. Patent and Trademark Office for the U.S. Appl. No. 15/067,239, dated Jun. 22, 2017.

Notice of Allowance issued by the United States Patent and Trademark Office for the U.S. Appl. No. 15/067,239, dated Dec. 22, 2017.

Office Action with Form PTO-892 Notice of References Cited issued by the U.S. Patent and Trademark Office for the U.S. Appl. No. 15/925,848, dated May 18, 2018.

Notice of Allowance issued by the United States Patent and Trademark Office for the U.S. Appl. No. 15/925,848, dated Jan. 25, 2019.

Office Action with Form PTO-892 Notice of References Cited issued by the U.S. Patent and Trademark Office for the parent U.S. Appl. No. 16/393,926, dated May 28, 2019.

Notice of Allowance issued by the United States Patent and Trademark Office for the parent U.S. Appl. No. 16/393,926, dated Oct. 10, 2019.

* cited by examiner

METHOD OF MANUFACTURING LIGHT EMITTING DEVICE

CROSS-REFERENCE TO RELATED APPLICATIONS

The present application is a continuation application of the U.S. patent application Ser. No. 16/393,926 filed on Apr. 24, 2019, which is a continuation application of the U.S. patent application Ser. No. 15/925,848 filed on Mar. 20, 2018 and issued as the U.S. Pat. No. 10,391,727, which is a continuation application of the U.S. patent application Ser. No. 15/067,239 filed on Mar. 11, 2016 and issued as the U.S. Pat. No. 9,956,731, which claims priority under 35 U. S. C. § 119 to Japanese Patent Application No. 2015-050645, filed Mar. 13, 2015. The contents of these applications are incorporated herein by reference in their entirety.

BACKGROUND

Technical Field

The present disclosure relates to a method of manufacturing a light emitting device.

Discussion of the Background

International Publication No. WO2012/099145 describes a batwing shaped light distribution characteristic which is achieved by devising a molded shape of a light emitting device. The contents of International Publication No. WO2012/099145 are incorporated herein by reference in their entirety.

SUMMARY OF THE INVENTION

According to one aspect of the present invention, a method of manufacturing a light emitting device includes providing a substrate on which a light source is disposed. An underfill material is ejected from a nozzle onto the substrate substantially around the light source in a circular shape, a shape of a letter 'C', or a rectangular shape. A covering member having a recess portion is provided above the light source.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

The embodiments will now be described with reference to the accompanying drawings, wherein like reference numerals designate corresponding or identical elements throughout the various drawings.

Hereinafter, embodiments of the present invention will be described with reference to the drawings. However, a light emitting device and a method of manufacturing the same in the following description are only provided to embody a technical idea, and the present invention is not limited to the following description unless otherwise specified. Furthermore, contents described in one embodiment and one example can be applied to another embodiment and another example.

Furthermore, the same name or reference numeral represents the same or similar member, and a detailed description is omitted as appropriate. Furthermore, as for each component in the embodiments of the present invention, a plurality of components may be formed of the same member so that one member serves as the plurality of components, or to the contrary, a function of one member may be implemented with a plurality of members.

First Embodiment

Figure 1A:
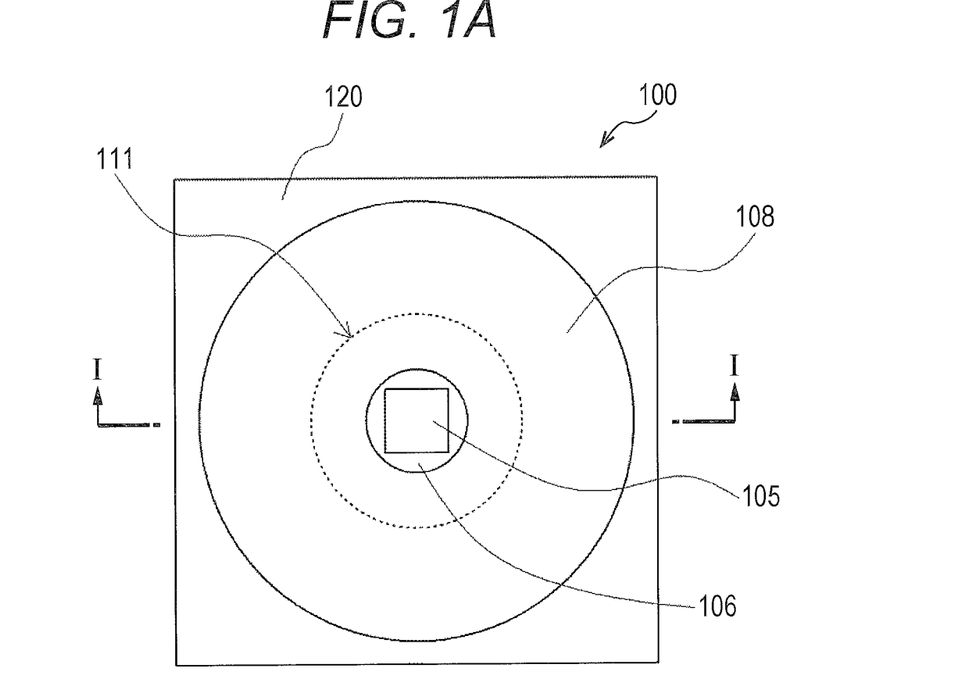
FIGS. 1A and 1B are a schematic top view and a schematic cross-sectional view illustrating a structure of a light emitting device according to a first embodiment.
Figure 1B:
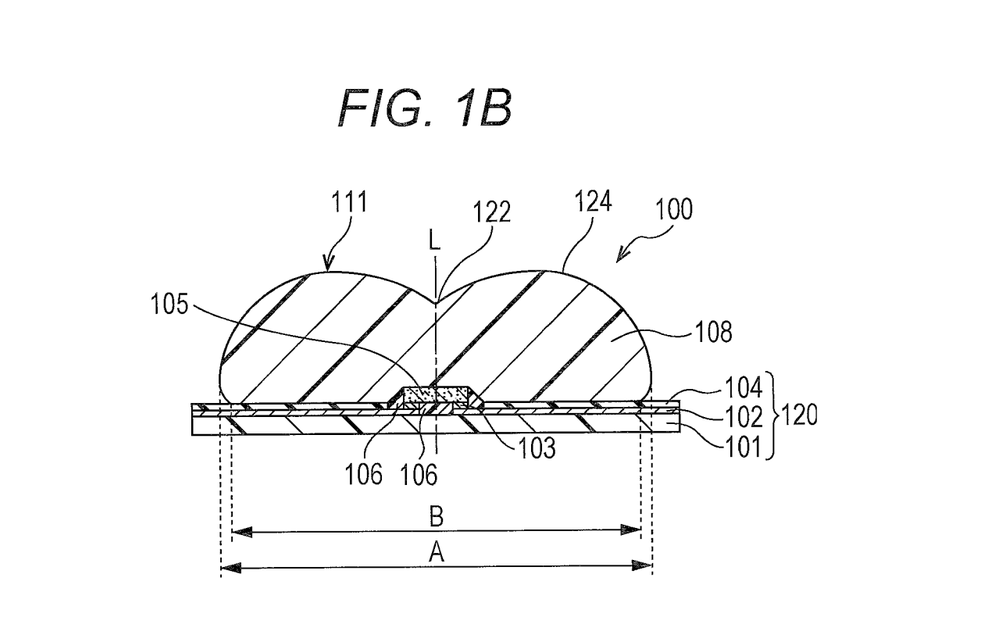

FIGS. 1A and 1B are a schematic top view and a schematic cross-sectional view illustrating a structure of a light emitting device according to the first embodiment. FIG. 1A is the schematic top view, and FIG. 1B is the schematic cross-sectional view taken along line I-I in FIG. 1A.

As illustrated in FIGS. 1A and 1B, a light emitting device 100 includes a substrate 120, a light emitting element 105 provided on the substrate 120, and a covering member 108 for covering the light emitting element 105. The covering member 108 has a recess portion 122 immediately above the light emitting element 105, and has a projection portion 124 around the recess portion 122 in planar view. Here, a peak portion 111 serving as an uppermost portion of the projection portion 124 is formed into a substantially circular shape in top view.

The covering member 108 is formed such that a width B of a bottom surface is smaller than a maximum width A of the covering member 108. Here, the bottom surface means a connection surface of the covering member 108 with the substrate 120. In other words, a cross-sectional diameter of the connection surface of the covering member 108 with the substrate 120 is not a maximum cross-sectional diameter of the covering member 108. That is, the covering member 108 near the substrate 120 is formed into an inverted tapered shape. Thus, light emitted from the light emitting element 105 in a direction perpendicular to an optical axis L can be refracted and directed to an upper side of the substrate, so that the light can be more externally extracted without hitting the substrate 120.

Substrate 120

The substrate 120 is a member on which the light emitting element 105 is set, and as illustrated in FIGS. 1A and 1B, includes an electrically conductive wiring 102 for supplying power to the light emitting element 105, and a base member 101 on which the electrically conductive wiring 102 is disposed in an insulated manner.

Examples of the material of the base member 101 include resin such as phenol resin, epoxy resin, polyimide resin, BT resin, polyphthalamide (PPA), or polyethylene terephthalate (PET), and ceramics. Among them, resin is preferably selected as an insulating material in view of low cost and moldability. Alternatively, ceramics is preferably selected as the material of the base member 101 in order to give high heat resistance and light resistance to the light emitting device. The ceramics includes alumina, mullite, forsterite, glass ceramics, nitride series (such as AlN), and carbide series (such as SiC). Among them, ceramics composed of alumina or ceramics containing alumina as a major component is preferably used.

In the case where the base member 101 is made of resin, glass fiber, or an inorganic filler of $SiO_2$, $TiO_2$, or $Al_2O_3$ may be mixed with the resin, to improve mechanical strength, to reduce thermal expansion rate, and to increase light reflectivity. Furthermore, the substrate 120 may be a metal member having an insulating portion.

The electrically conductive wiring 102 is electrically connected to an electrode of the light emitting element 105, and externally supply a current (power) thereto. In other words, the electrically conductive wiring 102 serves as an electrode or a part of the electrode for externally applying the current. In general, at least two positive and negative electrically conductive wirings are formed separately.

The electrically conductive wiring 102 is formed at least on an upper surface serving as a mounting surface of the light emitting element 105 in the substrate 120. The material of the electrically conductive wiring 102 may be appropriately selected depending on the material of the base member 101 and a manufacturing method. For example, in the case where the base member 101 is made of ceramics, the material of the electrically conductive wiring 102 is preferably a high melting temperature material which can endure a firing temperature of a ceramic sheet, such as a high melting temperature metal like tungsten and molybdenum. Furthermore, the surface of the electrically conductive wiring 102 may be covered with a metal material such as nickel, gold, or silver by plating, sputtering, or vapor deposition.

Furthermore, when the base member 101 is made of resin, the electrically conductive wiring 102 is preferably made of a readily processable material. Furthermore, when an injection molded resin is used for the material of the base member 101, the material of the electrically conductive wiring 102 is preferably a readily processable material in a punching process, an etching process, and a bending process, and has relatively high mechanical strength. More specifically, the electrically conductive wiring 102 may be a metal layer of copper, aluminum, gold, silver, tungsten, iron, nickel, iron-nickel alloy, phosphor bronze, copper-iron alloy, or molybdenum, or a lead frame. Furthermore, the surface of the electrically conductive wiring 102 may be covered with a metal material. This metal material is not particularly limited, but may be silver only, or a silver alloy with copper, gold, aluminum, or rhodium. In addition, the electrically conductive wiring 102 may be a multilayer film including the above silver and alloys. Furthermore, the metal material may be formed by a sputtering method or vapor deposition method other than a plating method.

Insulating Material 104

The substrate 120 may have the insulating material 104 as illustrated in FIG. 1B. The insulating material 104 preferably covers a region except for a portion in which the electrically conductive wiring 102 is electrically connected to the light emitting element 105 and another member. That is, as illustrated in FIG. 1B, a resist may be formed on the substrate to cover and insulate the electrically conductive wiring 102.

The insulating material 104 is formed to insulate the electrically conductive wiring, but when it contains a white filler similar to an underfill material which will be described below, the light can be prevented from leaking or being absorbed, so that light extraction efficiency can be improved in the light emitting device 100.

The insulating material 104 is not particularly limited as long as it is a material less likely to absorb the light from the light emitting element and has an insulating property. Examples of the material include epoxy, silicone, modified silicone, urethane resin, oxetane resin, acrylic, polycarbonate, and polyimide.

Light Emitting Element 105

The light emitting element 105 mounted on the substrate is not particularly limited, and it can be a well-known element, but in this embodiment, a light emitting diode is preferably used as the light emitting element 105.

The light emitting element 105 may emit any wavelength. For example, a blue light emitting element or a green light emitting element may be composed of ZnSe, nitride-based semiconductor ($In_xAl_yGa_{1-x-y}N$, $0 \leq x$, $0 \leq y$, $x+y \leq 1$), or GaP. Furthermore, a red light emitting element may be composed of GaAlAs or AlInGaP. Furthermore, a semiconductor light emitting element composed of another material may be used. A composition, an emitted light color, a size, and the number of light emitting elements may be appropriately selected according to purposes.

In a case where the light emitting device includes a wavelength conversion material, the nitride semiconductor ($In_xAl_yGa_{1-x-y}N$, $0 \leq x$, $0 \leq y$, $x+y \leq 1$) may be preferably used because it can emit light having a short wavelength which can efficiently excite the wavelength conversion material. The wavelength of the emitted light can be variously provided by selecting a material of a semiconductor layer and its mixed crystal rate. Positive and negative electrodes may be formed on the same surface or on different surfaces.

The light emitting element 105 has a substrate for growth, and the semiconductor layers stacked on the substrate for growth. The semiconductor layers include an n-type semiconductor layer, an active layer, and a p-type semiconductor layer formed sequentially in this order. An n-type electrode is formed on the n-type semiconductor layer, and a p-type electrode is formed on the p-type semiconductor layer. The substrate for growth may be a light-transmissive sapphire substrate.

As illustrated in FIG. 1B, the electrodes of the light emitting element 105 are flip-chip bonded to the electrically conductive wiring 102 formed on the surface of the substrate with a connection material 103 interposed therebetween, and a surface opposite to the surface having the electrodes serves as a light extraction surface which is a principle surface of the light-transmissive sapphire substrate. The light emitting element 105 is disposed across the two negative and positive electrically conductive wirings 102, and bonded thereto with the electrically conductive connection material 103. A mounting method of the light emitting element 105 may be, for example, a mounting method using a bump other than a mounting method using a solder paste.

Light Source

In this specification, the "light source" means a light emitting portion. Examples of the light source include the light emitting element 105, the light emitting element 105 having a wavelength conversion member, and a package incorporating the light emitting element (such as a light emitting device including a SMD, or a package type white LED), and its shape and structure are not particularly limited.

Connection Material 103

The connection material 103 is an electrically conductive member, and more specifically, it includes Au alloy, Ag alloy, Pd alloy, In alloy, Pb—Pd alloy, Au—Ga alloy, Au—Sn alloy, Sn alloy, Sn—Cu alloy, Sn—Cu—Ag alloy, Au—Ge alloy, Au—Si alloy, Al alloy, Cu—In alloy, and a mixture of metal and flux.

The connection material 103 may be in liquid form, paste form, or solid form (sheet form, block form, powder form, or wire form), and it can be appropriately selected according to a composition and a shape of a support member. Furthermore, the connection material 103 may be a single member, or a combination of several kinds of members.

Underfill Material 106

As illustrated in FIG. 1B, the underfill material 106 is preferably provided between the light emitting element 105 and the substrate 120. The underfill material 106 contains a filler for the purpose of efficiently reflecting the light from the light emitting element 105 and bringing its thermal expansion rate close to that of the light emitting element 105.

The underfill material 106 is not particularly limited as long as it is less likely to absorb the light from the light emitting element. For example, the underfill material 106 includes epoxy, silicone, modified silicone, urethane resin, oxetane resin, acrylic, polycarbonate, and polyimide.

When the filler contained in the underfill material is a white filler, the light is more likely to be reflected, and the light extraction efficiency can be improved. Furthermore, as the filler, an inorganic compound is preferably used. Here, the white filler includes a case where, even when the filler itself is transparent, it looks white due to scattering because of a difference in refractive index from a material around the filler.

Here, a reflectivity of the filler is preferably 50% or more with respect to the wavelength of the emitted light, and more preferably 70% or more. In this case, the light extraction efficiency can be improved in the light emitting device 100. A grain diameter of the filler is preferably between 1 nm and 10 μm (inclusive). When the grain diameter of the filler falls within this range, the resin has a high fluidity as the underfill material, and even a small space can be covered properly. Furthermore, the grain diameter of the filler is more preferably between 100 nm and 5 μm (inclusive), and still more preferably between 200 nm and 2 μm (inclusive). In addition, a shape of the filler may be a spherical shape or scale-like shape.

More specifically, examples of the filler material include oxides such as $SiO_2$, $Al_2O_3$, $Al(OH)_3$, $MgCO_3$, $TiO_2$, $ZrO_2$, ZnO, $Nb_2O_5$, MgO, $Mg(OH)_2$, SrO, $In_2O_3$, $TaO_2$, HfO, SeO, and $Y_2O_3$, nitrides such as SiN, AlN, and AlON, and fluorides such as $MgF_2$. These may be used alone or mixed.

In addition, a side surface of the light emitting element 105 is covered with the underfill material 106 in the example of FIG. 1B, but the side surface of the light emitting element 105 may not be covered with the underfill material 106 by appropriately selecting and adjusting the grain diameter of the filler and the underfill material. This is because when the side surface of the light emitting element 105 is exposed from the underfill material 106, the side surface of the light emitting element can serve as a light extraction surface.

Covering Member 108

The covering member 108 is formed on the substrate to cover the light emitting element 105 in order to protect the light emitting element 105 from an external environment, and to optically control the light emitted from the light emitting element 105.

As the material of the covering member 108, a light-transmissive resin such as epoxy resin, silicone resin, or mixed resin of those, and glass may be used. Among them, the silicone resin is preferably selected in view of light resistance and moldability.

Furthermore, the covering member 108 may contain a wavelength conversion material which absorbs the light from the light emitting element and emits light having a wavelength different from that of the light emitted from the light emitting element, and a light diffusing agent which diffuses the light from the light emitting element. Furthermore, the covering member 108 may contain a coloring agent so as to correspond to the light color of the light emitting element. Furthermore, since the covering member 108 serves to control a light distribution from the light source, it is preferable to limit content amounts of the wavelength conversion material, the diffusing material, and the coloring agent so that the covering member 108 can control the light distribution.

The covering member 108 may be formed by compression molding or injection molding so as to cover the light emitting element 105. Other than that, as will be described below, the material of the covering member 108 may be dropped or drawn on the light emitting element 105 after its viscosity is optimized, so that it can be formed into the shape illustrated in FIGS. 1A and 1B due to its surface extension.

Furthermore, the covering member preferably has a height in a direction of an optical axis smaller than a width. Thus, a brightness peak position of a batwing light distribution can be provided on a wider angle side.

Method of Manufacturing Light Emitting Device

Hereinafter, a method of manufacturing the light emitting device 100 will be described with reference to FIGS. 7A to 7F.

First, the substrate 120, on which the light emitting element 105 is disposed, is prepared. Here, as one example, one light emitting device 100 is illustrated, but a plurality of light emitting elements 105 may be provided on one substrate, and one covering member 108 may be formed on each of the light emitting elements 105. Alternatively, the number of the light emitting elements 105 to be covered by one covering member 108 is not limited to one, and the plurality of light emitting elements 105 may be collectively covered with one covering member 108.

Figure 7A:
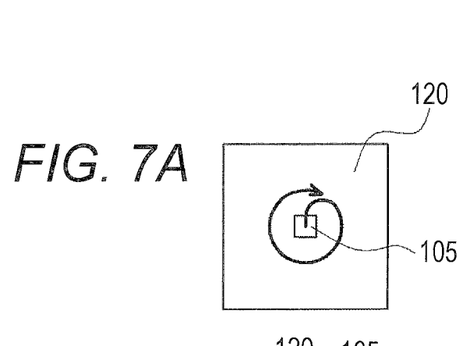
FIGS. 7A to 7F are schematic views each illustrating a method of manufacturing the light emitting device according to the first embodiment.

Subsequently, while the resin of the covering member 108 is ejected from a nozzle, the resin is applied onto the substrate 120 and the light emitting element 105, substantially around the light emitting element 105 in a circular shape. FIG. 7A illustrates with an arrow the movement of the nozzle while the resin is applied. As illustrated in FIG. 7A, the application of the resin starts from the top of the light emitting element 105 and goes around the light emitting element 105 circularly. In this case, it is preferred that a resin ejection amount is small at the top of the light emitting element 105 (the application start position), so that the resin application amount at the top is smaller than the resin application amount in the region around the light emitting element 105.

Figure 7B:
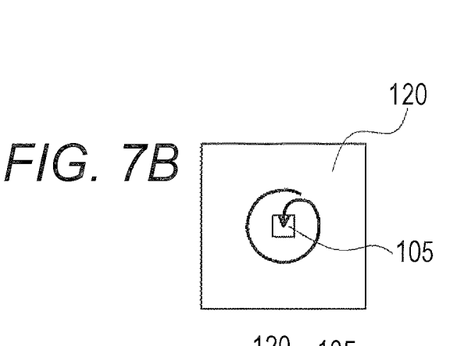
Figure 7C:
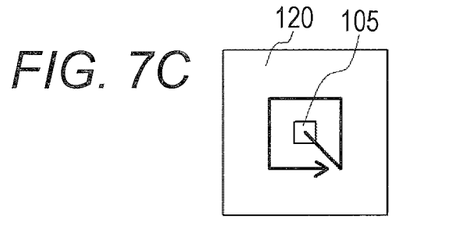
Figure 7D:
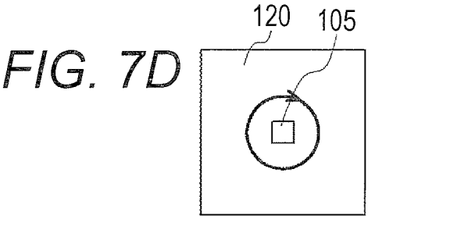
Figure 7E:
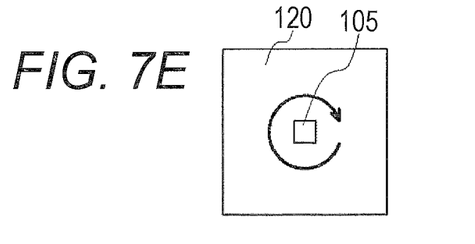
Figure 7F:
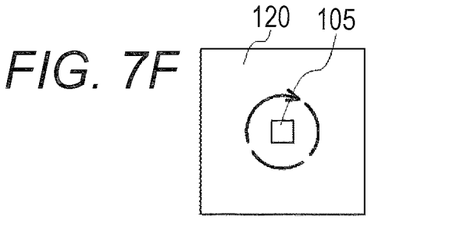

In addition, as illustrated in FIG. 7D, the resin may be applied so as to circularly surround the light emitting element 105, and the resin is wet and spread on the light emitting element 105, so that the light emitting element 105 is covered with the resin of the covering member 108.

In this way, the resin is applied while the nozzle is moved, and the resin is then hardened, so that the covering member 108 has the recess portion 122 immediately above the light emitting element 105, and has the projection portion 124 around the recess portion 122 in planar view as illustrated in FIGS. 1A and 1B. Thus, the covering member 108 can be formed by a simple method without using a die. Furthermore, in order to adjust the viscosity of the material of the covering member 108 in this method, the above-described fluorescent material or diffusing agent may be used other than adjusting the viscosity of the material itself.

FIG. 7B illustrates an example in which application of the sealing resin starts from the outside of the light emitting element 105 and ends at the top of the light emitting element 105. That is, the nozzle for applying the resin is moved in a direction opposite to that in FIG. 7A. In this case, by reducing an application amount at the end position, the recess portion 122 can be formed as described above.

Furthermore, the resin is not necessarily applied in the circular shape, and it may be applied in a polygonal shape. For example, the resin may be applied along the outer shape of the light emitting element in planar view, that is, as illustrated in FIG. 7C, it may be applied in a rectangular shape along the shape of the rectangular light emitting element.

Furthermore, by adjusting the viscosity of the resin to be applied to adjust a contact angle with the substrate 120, the covering member 108 can be readily formed into the shape in which the width B of the bottom surface is smaller than the maximum width A of the covering member 108 as illustrated in FIG. 1B. Thus, the covering member 108 near the substrate 120 can be readily formed into the inverted-tapered shape, so that the light emitting device is excellent in external light extraction efficiency. In addition, the covering member 108 may be formed into a shape in which the width of the bottom surface is the maximum width.

Furthermore, in the case where the underfill material is formed as illustrated in FIG. 1B, after the light emitting element 105 is set on the substrate 120, the resin of the underfill material is ejected from a nozzle around an outer periphery of the light emitting element 105 in a circular or rectangular shape. Thereafter, it is left for a certain time, and the underfill material moves and flows into a space between the light emitting element 105 and the substrate 120. Then, the underfill material is heated and hardened in this state and completed.

According to the light emitting device of this embodiment, the batwing light distribution can be realized, so that even when the adjacent light sources are apart from each other by 20 mm or more, brightness unevenness is reduced in the light emitting device.

Second Embodiment

Figure 2:
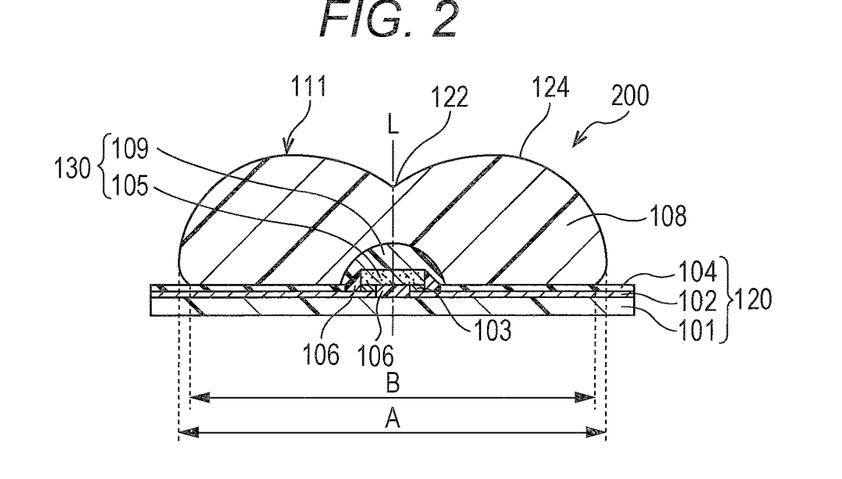
FIG. 2 is a schematic cross-sectional view illustrating a structure of a light emitting device according to a second embodiment.

As illustrated in FIG. 2, a light emitting device 200 according to the second embodiment differs from the light emitting device 100 according to the first embodiment in that a light source 130 includes a light emitting element 105 and a wavelength conversion member 109 covering the light emitting element 105. In other portions, similar members to those in the light emitting device 100 according to the first embodiment are used and configured similarly.

The wavelength conversion member 109 is formed so as to cover an upper surface of the light emitting element 105. A side surface of the light emitting element 105 is covered with an underfill material 106, so that the wavelength conversion member 109 is not directly in contact with the side surface of the light emitting element 105 in FIG. 2, but the side surface of the light emitting element 105 may be directly covered with the wavelength conversion member 109.

Wavelength Conversion Member 109

The wavelength conversion member 109 absorbs the light from the light emitting element 105 and converts a wavelength of the light to a different wavelength of light.

Examples of the wavelength conversion member 109 include yttrium-aluminum-garnet (YAG)-based fluorescent material which is activated with cerium, lutetium-aluminum-garnet (LAG)-based fluorescent material which is activated with cerium, nitrogen-containing calcium aluminosilicate (CaO—$Al_2O_3$—$SiO_2$)-based fluorescent material which is activated with europium and/or chrome, silicate ((Sr, Ba)$_2$SiO$_4$)-based fluorescent material which is activated with europium, β-sialon fluorescent material, nitride-based fluorescent material such as CASN-based or SCASN-based fluorescent material, KSF ($K_2SiF_6$: Mn)-based fluorescent material, and sulfide-based fluorescent material. Furthermore, other than the above florescent material, the fluorescent material having the same function, action, and effect may be also used.

In addition, the wavelength conversion member 109 may be a light emitting material called nanocrystal or a quantum dot. This material may be a semiconductor material such as group II-VI, group III-V, or group IV-VI semiconductors. More specifically, examples of the material include nano-sized high-dispersion particles of CdSe, core-shell CdS$_x$Se$_{1-x}$/ZnS, or GaP.

A height of the wavelength conversion member 109 in a direction of an optical axis L is preferably ⅘ or less of a maximum width of a covering member 108. Thus, a lens effect of the covering member 108 can be maintained.

Method of Manufacturing Light Emitting Device 200

The light emitting device 200 can be formed similarly to the light emitting device 100 except that only the light emitting element 105 serves as the light source in the light emitting device 100, while the light emitting element 105 and the wavelength conversion member 109 serve as the light source in the light emitting device 200.

The wavelength conversion member 109 may be formed into a convex shape by potting a light-transmissive resin containing a fluorescent material and a quantum dot, or may be formed by a printing method or electrophoresis method. In addition, the wavelength conversion member may be molded into a sheet shape and attached on the light emitting element.

The same effect as in the light emitting device 100 can be obtained in the light emitting device 200.

Furthermore, according to the light emitting device 200, the wavelength conversion member 109 is formed around the light emitting element 105 and serves as the light source 130, and the light source 130 is covered with the covering member 108 which practically does not contain the wavelength conversion member 109. Thus, compared with the case where the entire covering member 108 converts the wavelength, the batwing light distribution characteristic can be readily controlled.

Third Embodiment

Figure 3A:
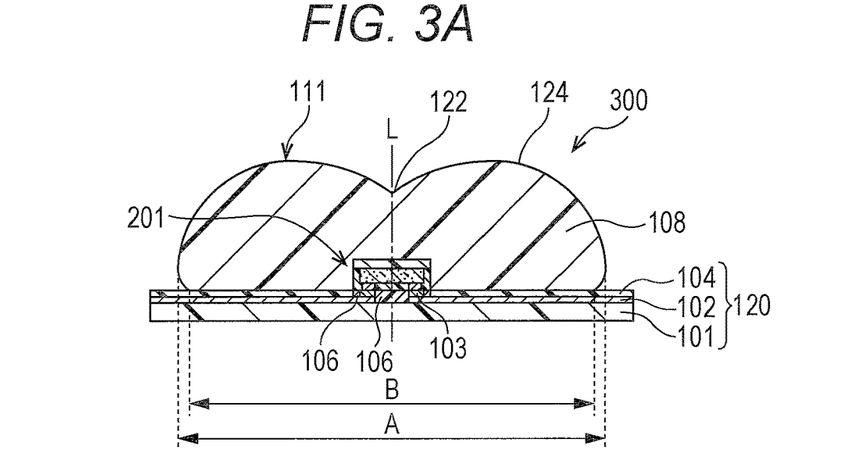
FIGS. 3A and 3B are schematic cross-sectional views each illustrating a structure of a light emitting device according to a third embodiment.

As illustrated in FIG. 3A, according to a light emitting device 300 of the third embodiment, a small package-type white LED 201 is used as a light source, and except for that, the third embodiment is similar to the first embodiment. Therefore, the light emitting device 300 achieves an effect similar to that in the first embodiment. The package-type white LED 201 is electrically connected to a substrate 120 with a connection material 103 interposed therebetween. Due to this configuration, a white color can be previously selected as the light source, so that a product yield concerning chromaticity can be improved.

Package-Type White LED

As for the package-type white LED 201, a light emitting element 105 and a wavelength conversion member 109 are housed in a package, and an external connection terminal is provided therein.

In particular, the package-type white LED 201 is preferably a CSP type because its size is close to the housed light emitting element. Furthermore, in order to enhance light extraction efficiency, a light reflecting member is preferably provided therein.

Figure 3B:
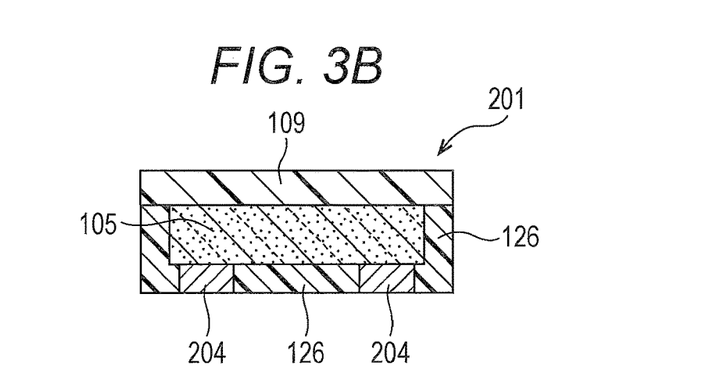

For example, the package-type white LED 201 illustrated in FIG. 3B has a light reflecting member 126 formed on a side surface and a lower surface of the light emitting element 105, and an external connection terminal 204 is exposed at the lower surface. Furthermore, a wavelength conversion member 109 is formed so as to cover upper surfaces of the light emitting element 105 and the light reflecting member 126. As illustrated in FIG. 3A, an underfill material 106 is provided in a space between the package-type white LED 201 and the substrate 120.

Fourth Embodiment

Figure 4:
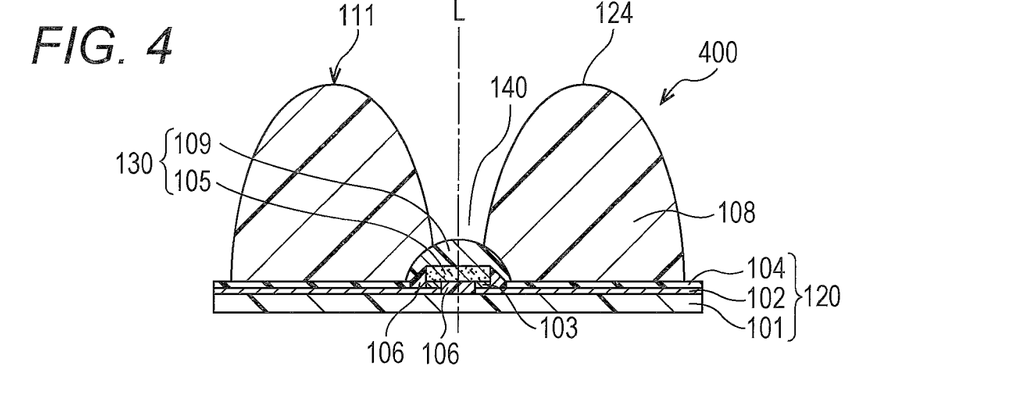
FIG. 4 is a schematic cross-sectional view illustrating a structure of a light emitting device according to a fourth embodiment.

As illustrated in FIG. 4, a light emitting device 400 according to the fourth embodiment differs from the second embodiment in that a surface of a light source 130 formed of a light emitting element 105 and a wavelength conversion member 109 is partially exposed from a covering member 108. That is, the covering member 108 has a through hole 140 through which the light source 130 is exposed, and has a projection portion outside the through hole 140 in planar view. An outer periphery of the wavelength conversion member 109 is covered with the covering member 108. In other portions, similar members to those in the light emitting device 200 according to the second embodiment are used and configured similarly.

The covering member 108 is preferably formed into a circular shape in top view, but it may be cut halfway such as a shape of C in top view, for example.

A method of forming the covering member 108 of the light emitting device 400 may be similar to that of the light emitting device 100 according to the first embodiment except that resin is to be applied around the light source 130 circularly so that the resin is not applied to a part of an upper surface of the light source 130 around an optical axis L, but the resin is applied to the outer periphery of the wavelength conversion member 109 (for example, as illustrated in FIG. 7D).

In addition, the resin may be applied into a shape of C (FIG. 7E) or in a shape of a broken circle (FIG. 7F), and hardened as it is.

In this case, as described in the above embodiment, the width of the bottom surface of the covering member 108 may be smaller than the maximum width of the covering member 108, or as illustrated in FIG. 4, the width of the bottom surface of the covering member 108 may be the maximum width of the covering member 108.

According to the light emitting device 400, compared with the light emitting device 200 according to the second embodiment, light extraction efficiency can be enhanced on a wide light distribution angle side with respect to the direction of the optical axis L of the light source 130.

Fifth Embodiment

Figure 5:
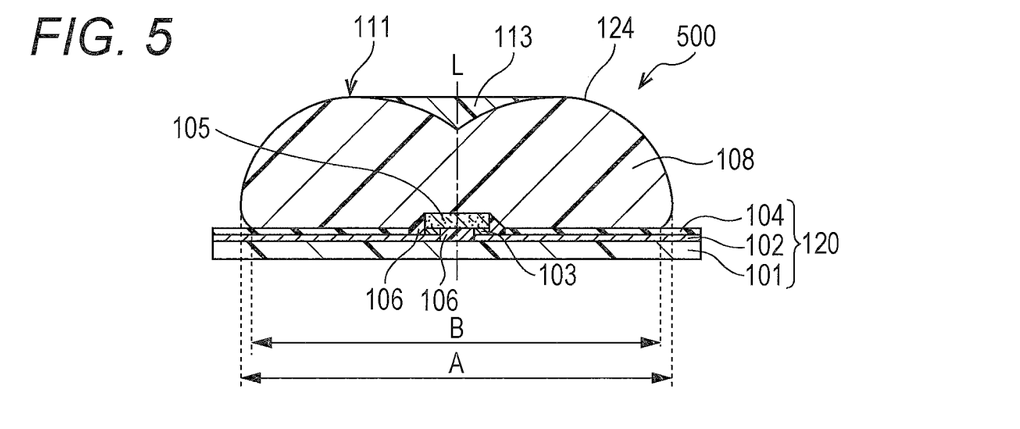
FIG. 5 is a schematic cross-sectional view illustrating a structure of a light emitting device according to a fifth embodiment.

As illustrated in FIG. 5, a light emitting device 500 according to the fifth embodiment is similar to the light emitting device 100 according to the first embodiment except that a light reflecting/diffusing region 113 is formed on a covering member 108 above a light emitting element 105 to reflect and/or diffuse the light, so that the similar effect can be provided.

In this configuration, the light emitted along an optical axis L is bent in a horizontal direction, so that light intensity along the optical axis L can be reduced compared with the light emitting device 100 according to the first embodiment.

More specifically, the light reflecting/diffusing region 113 for reflecting and/or diffusing the light may be made of material similar to the underfill material 106, and may be formed by extrusion molding after the covering member 108 is hardened, or may be formed by disposing a reflecting member made of thermoplastic resin on the covering member 108 and then softening it in a following heat treatment.

Sixth Embodiment

Figure 6:
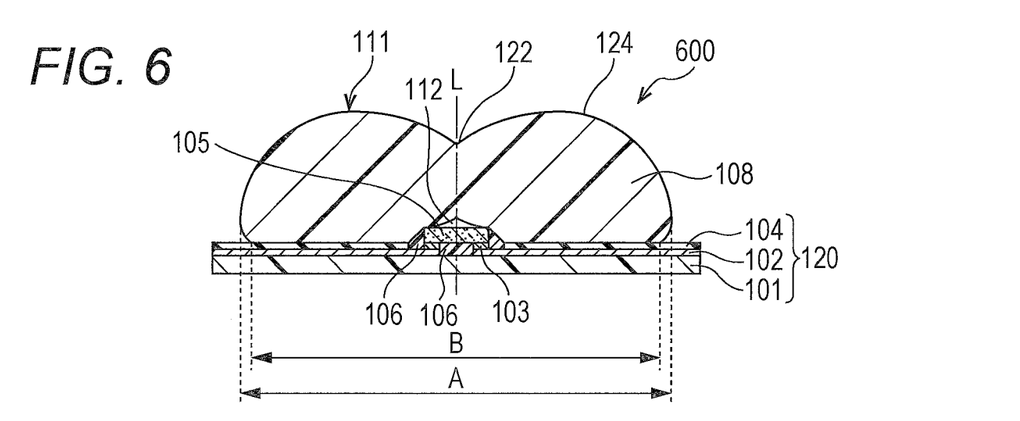
FIG. 6 is a schematic cross-sectional view illustrating a structure of a light emitting device according to a sixth embodiment.

As illustrated in FIG. 6, a light emitting device 600 according to the sixth embodiment is similar to the light emitting device 100 according to the first embodiment except that a covering member 108 includes a bubble 112 on a light emitting element 105. In addition, in this configuration, the covering member 108 does not necessarily have a circular peak portion, and a batwing light distribution can be realized even when the covering member 108 has a normal domed shape. In addition, a shape of the bubble 112 includes several shapes such as spherical shape, teardrop shape, or pyramidal shape.

For example, as illustrated in FIG. 6, when the shape of the bubble 112 is a square pyramidal shape having a bottom surface shape substantially equivalent to an upper surface shape of the light emitting element, the light emitted along an optical axis L is totally reflected, refracted, or scattered at an interface of the bubble 112, so that light intensity to the optical axis L can be reduced.

The bubble 112 can be formed in the light emitting device 600 in such a manner that before the resin of the covering member 108 is applied, a light source is subjected to an oil repelling treatment, and then the resin of the covering member 108 is applied from above. In addition, the bubble 112 may be formed by applying a foaming agent to the light source before the resin is applied.

EXAMPLE

Hereinafter, the example according to the present invention will be described in detail. Furthermore, the present invention is not limited to the following example as a matter of course.

FIGS. 1A and 1B are a schematic top view and a schematic cross-sectional view of a light emitting device 100 according to this example. In this example, a light emitting element 105 is mounted on a base member 101 in such a manner that it strides across a pair of positive and negative electrically conductive wirings 102 provided on the base member 101 with a connection material 103 therebetween. In addition, an insulating material 104 is formed in a region except for an electrical connection region.

Furthermore, an underfill material 106 having a light reflecting function is formed on a lower portion and a side surface of the light emitting element 105, and a covering member 108 is formed on an upper portion thereof. The covering member 108 has a recess portion 122 immediately above the light emitting element 105 serving as a light source, and a projection portion 124 is provided outside the recess portion 122. A top portion (peak portion 111) of the covering member 108 has a ring-like shape (substantially donut-like shape) in top view.

In this example, the base member 101 is made of glass epoxy base material, the electrically conductive wiring 102 is made of Cu (35 µm), and the insulating material 104 is made of epoxy-based white solder resist. Furthermore, the light emitting element 105 is a nitride-based blue LED having a square shape having one side of 600 µm and a thickness of 150 µm. The underfill material 106 is made of silicone resin containing 30 wt % of titanium oxide filler, and the covering member 108 is made of silicone resin.

Furthermore, it is preferred that the covering member 108 in this example does not have a light diffusing property, but it contains a minimal amount of filler to provide a thixiotropic nature to the covering member. Thus, the light emitting device formed as described above can achieve a light distribution characteristic as illustrated in FIG. 8.

Figure 8:
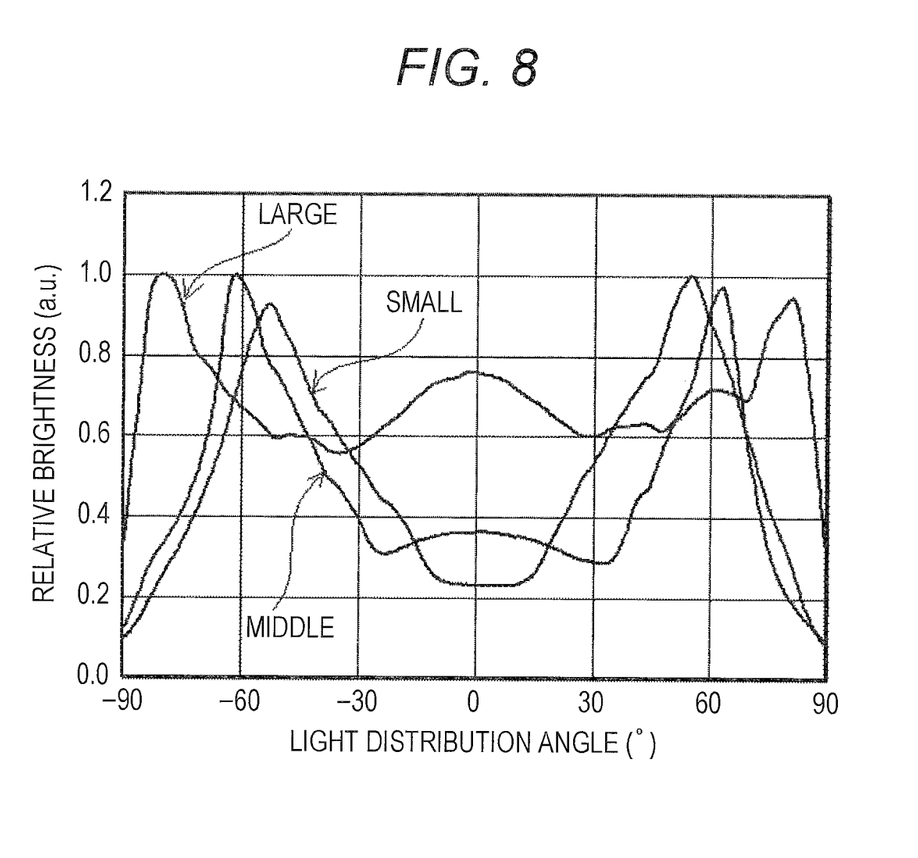
FIG. 8 is a schematic graph illustrating light distribution characteristic of a light emitting device according to an example.

In addition, FIG. 8 is a schematic graph illustrating three patterns of a large diameter (3.3 mm), a middle diameter (3.0 mm), and a small diameter (2.8 mm) of the peak portions 111 of the covering members 108. It can be seen from this graph that as the diameter of the peak portion 111 is increased, the light from the light emitting element 105 more widely spreads. In this way, by controlling the diameter of the peak portion 111, an angle of a corner portion of the batwing light distribution can be controlled.

A light emitting device according to an embodiment includes a substrate, a light source provided on the substrate, and a covering member for covering the light source, in which the covering member has a recess portion or a through hole immediately above the light source, and a width of a bottom surface of the covering member is smaller than a maximum width of the covering member.

Furthermore, a method of manufacturing the light emitting device according to an embodiment includes the steps of preparing a substrate on which a light source is disposed, applying resin onto the substrate substantially around the light source in a circular shape or a rectangular shape while the resin is ejected from a nozzle, and hardening the resin to form a covering member including a recess portion or a through hole immediately above the light source.

According to the embodiment of the present invention, there is provided the batwing type light emitting device having high light emission efficiency. Furthermore, according to the method of manufacturing the light emitting device, the light emitting device can be manufactured without using a die, and achieve the batwing light distribution.

Obviously, numerous modifications and variations of the present invention are possible in light of the above teachings. It is therefore to be understood that within the scope of the appended claims, the invention may be practiced otherwise than as specifically described herein.

What is claimed is:

1. A method of manufacturing a light emitting device, comprising:
    providing a substrate on which a light source is disposed;
    ejecting resin from a nozzle onto the substrate substantially around the light source in a circular shape, a shape of a letter 'C', or a rectangular shape, such that the resin is separated from a center of an upper surface of the light source; and
    hardening the resin to provide a covering member.

2. The method according to claim 1, wherein the covering member is provided such that the covering member has a height in a direction of an optical axis of the light emitting device and a width in a direction perpendicular to the optical axis, the height being smaller than the width.

3. The method according to claim 1, further comprising:
    providing an additional covering member on an additional light source,
    wherein the substrate is provided such that the additional light source is disposed on the substrate and apart from the light source by 20 mm or more.

4. The method according to claim 1, wherein the covering member is provided such that the covering member is within the substrate when viewed along the optical axis.

5. The method according to claim 1,
    wherein the substrate includes an insulating material at the substrate top surface, and
    wherein the insulating material includes a white filler.

6. The method according to claim 1, further comprising:
    ejecting an underfill material from a nozzle onto the substrate substantially around the light source in a circular shape, a shape of a letter 'C', or a rectangular shape.

7. The method according to claim 6, wherein the light source includes a light emitting element.

8. The method according to claim 7 wherein the light source further includes a wavelength conversion member.

9. The method according to claim 8, wherein a height of the wavelength conversion member in a direction of the optical axis is $4/5$ or less of a maximum width of the covering member on a plane perpendicular to the optical axis viewed in the direction of the optical axis.

10. The method according to claim 7, wherein the light source further includes a light reflecting member formed on a side surface of the light emitting element and a lower surface of the light emitting element, and an external connection terminal provided at lower surface and uncovered by the light reflecting member.

11. The method according to claim 10, wherein the light source further includes a wavelength conversion member covering a top surface of the light emitting element and a top surface of the light reflecting member.

12. The method according to claim 7, wherein the underfill material including epoxy, silicone, modified silicone, urethane resin, oxetane resin, acrylic, polycarbonate, and polyimide.

13. The method according to claim 12, wherein the underfill material further includes a filler made of an inorganic compound.

14. The method according to claim 1, wherein the resin is applied from the light source.

15. The method according to claim 1, wherein the resin is applied after the light source is subjected to an oil repelling treatment.

16. The method according to claim 1, wherein the resin is applied after a foaming agent is applied to the light source.

17. The method according to claim 1, wherein the resin covers the center of the light source such that a gap is provided between the resin and the center of the upper surface of the light source.

18. A light emitting device comprising:
- a substrate;
- a light source disposed on the substrate and having a bottom surface facing the substrate and an upper surface opposite to the bottom surface in a height direction along a height of the light emitting device; and
- a covering member including resin and covering a periphery of the upper surface of the light source such that the covering member is separated from a center of the upper surface of the light source.

19. The light emitting device according to claim 18, wherein a gap is provided between the resin and the center of the upper surface of the light source.

20. The light emitting device according to claim 18, wherein the covering member does not cover the light source.

* * * * *